(12) United States Patent
Tajima et al.

(10) Patent No.: US 7,696,743 B2
(45) Date of Patent: Apr. 13, 2010

(54) ZERO-PHASE CURRENT DETECTING APPARATUS

(75) Inventors: Daisuke Tajima, Tokyo (JP); Hirokazu Nakabayashi, Tokyo (JP); Naoki Nishio, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 433 days.

(21) Appl. No.: 11/814,835

(22) PCT Filed: Aug. 31, 2006

(86) PCT No.: PCT/JP2006/317195

§ 371 (c)(1),
(2), (4) Date: Jul. 26, 2007

(87) PCT Pub. No.: WO2008/026276

PCT Pub. Date: Mar. 6, 2008

(65) Prior Publication Data

US 2009/0289618 A1    Nov. 26, 2009

(51) Int. Cl.
*G01R 33/00* (2006.01)
(52) U.S. Cl. .................................. 324/127; 324/117 R
(58) Field of Classification Search ................ None
See application file for complete search history.

(56) References Cited

U.S. PATENT DOCUMENTS 5,223,789 A * 6/1993 Katsuyama et al. ......... 324/127
5,283,726 A * 2/1994 Wilkerson ..................... 363/41
5,493,211 A    2/1996 Baker
6,316,931 B1  11/2001 Nakagawa et al.

FOREIGN PATENT DOCUMENTS

| JP | 3-216559 A | 9/1991 |
|----|------------|--------|
| JP | 7-043390 A | 2/1995 |
| JP | 7-280853 A | 10/1995 |
| JP | 11-248754 A | 9/1999 |
| JP | 2000-55940 A | 2/2000 |
| JP | 2001-066329 A | 3/2001 |
| JP | 2003-35730 A | 2/2003 |
| JP | 2004-153991 A | 5/2004 |
| JP | 2005-65382 A | 3/2005 |
| WO | 00/36427 A1 | 6/2000 |

OTHER PUBLICATIONS

Form PCT/ISA/210 (International Search Report) with English translation of category of cited documents, dated Nov. 28, 2006.
Form PCT/ISA/237 (Written Opinion of the International Searching Authority) dated Nov. 28, 2006.

* cited by examiner

*Primary Examiner*—Minh N Tang
(74) *Attorney, Agent, or Firm*—Buchanan Ingersoll & Rooney PC

(57) ABSTRACT

In a zero-phase current detecting apparatus, a feedback loop is made up of a pulse generating unit, a current detecting unit, a peak detecting unit, an adding unit, and a current regulating unit. The adding unit outputs a difference between a target value and a peak value detected by the peak detecting unit. A zero-phase current is detected based on the difference output from the adding unit as a result of regulation of the peak value so as to be the target value in the adding unit.

20 Claims, 12 Drawing Sheets

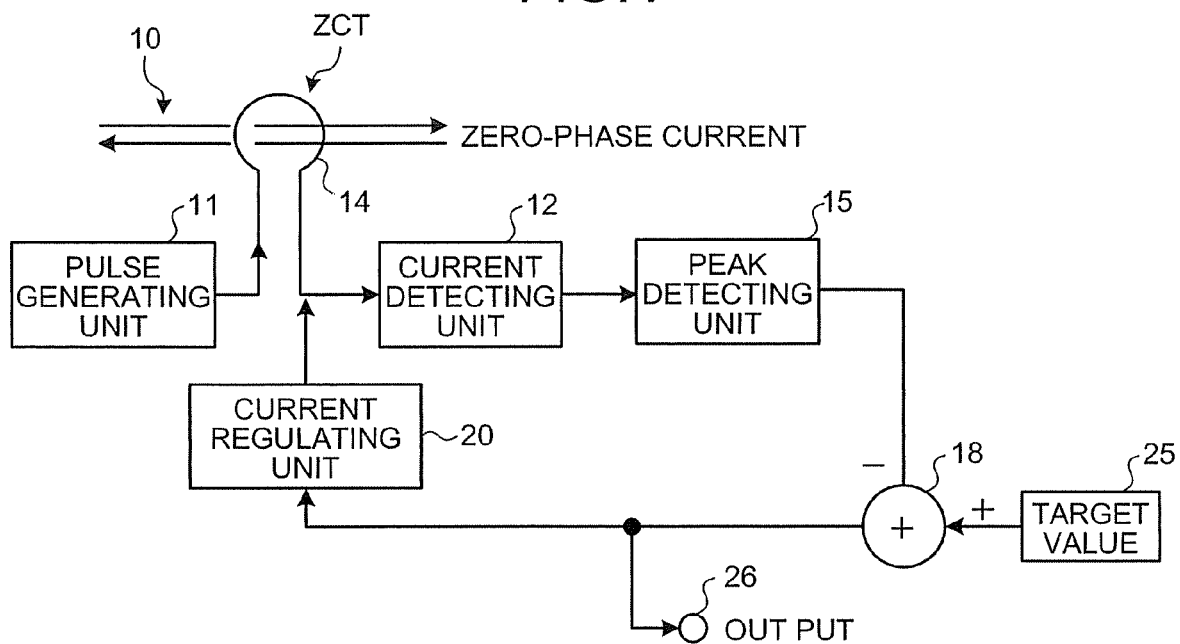
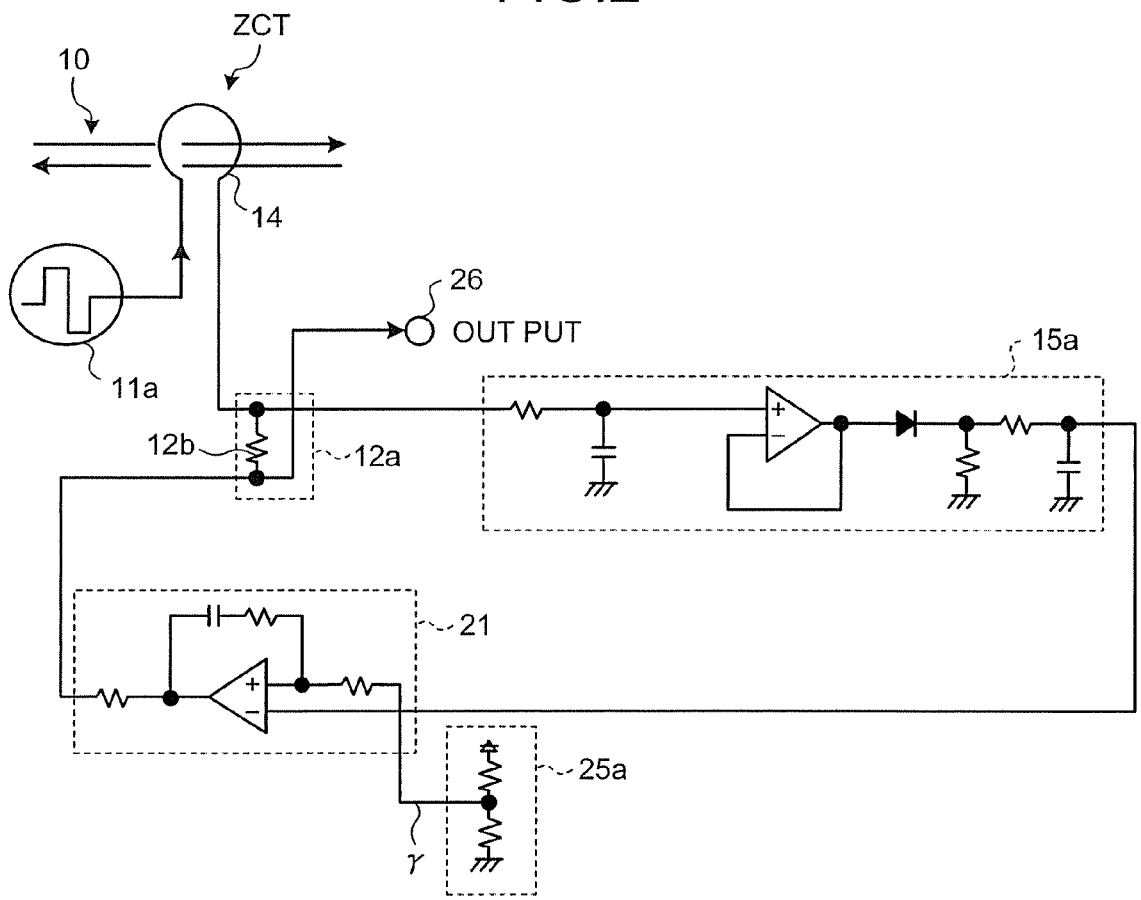

ZERO-PHASE CURRENT DETECTING APPARATUS

TECHNICAL FIELD

The present invention generally relates to a zero-phase current detecting apparatus. The present invention specifically relates to a zero-phase current detecting apparatus in which a zero-phase-sequence current transformer is used.

BACKGROUND ART

A Zero-phase-sequence Current Transformer (ZCT) is a device that detects a zero-phase current flowing in an electric power line inserted through its own detection core. A ZCT is used, for example, in switchboards, electrical devices and the like, as a detector that detects a ground-fault current caused by a ground fault.

Patent Documents 1 and 2 are examples of documents that disclose a current detecting apparatus and the like in which a ZCT is used. For example, Patent Document 1 discloses a direct-current ground-fault detecting apparatus that detects a ground fault of a direct current at a low cost with a high level of precision thereby ensuring a high level of safety. Patent Document 2 discloses a direct-current ground-fault current detecting circuit that accurately detects whether a direct-current ground-fault current has generated or accurately detects a direct-current value at a given moment without being influenced by the hysteresis characteristics of a ZCT.

Patent Document 1: Japanese Patent Application Laid-open No. 2004-153991
Patent Document 2: Japanese Patent Application Laid-open No. 2005-065382

DISCLOSURE OF INVENTION

Problem to be Solved by the Invention

In the direct-current ground-fault detecting apparatus disclosed in Patent Document 1, a detection output from the ZCT is corrected based on a detection output from a temperature sensor that detects an atmospheric temperature near the ZCT. Accordingly, it is necessary to modify data used in the correction process depending on the type and the model of the ZCT being used and also to store, in advance, the data used in the correction process into a storage device such as a ROM. Consequently, this direct-current ground-fault detecting apparatus has a problem in that the mode of control for detecting a zero-phase current with a high level of precision becomes complicated, and the costs of designing and manufacturing the detecting apparatus become high.

In he direct-current ground-fault current detecting circuit disclosed in Patent Document 2, the detecting circuit detects a current that flows on the secondary side of the ZCT (the side on which a detection coil wound around a detection core included in the ZCT is positioned; hereinafter, "the secondary side") by causing an offset current to flow on the primary side of the ZCT (the side on which the electric power line inserted through the detection core is positioned; hereinafter, "the primary side"). In this configuration, however, an output gain for the detection current detected in the detection coil on the secondary side varies, depending on the amount of the offset current that is caused to flow on the primary side. Thus, there is a problem in the direct-current ground-fault current detecting circuit disclosed in Patent Document 2 that the level of precision in the detection process for the zero-phase current degrades.

This invention has been made in view of the above. It is an object of the present invention to provide a zero-phase current detecting apparatus in which a ZCT is used and that makes it possible to prevent degradation in the level of precision in the detection process without increasing the costs.

Means for Solving Problem

To solve the above problems and achieve the objects, a zero-phase current detecting apparatus comprising a zero-phase-sequence current transformer that includes a detection coil and is operable to detect, via the detection coil, a zero-phase current flowing in an electric power line inserted through the zero-phase-sequence current transformer, includes a pulse generating unit that applies an excitation pulse signal to one end of the detection coil included in the zero-phase-sequence current transformer; a current detecting unit that is connected to other end of the detection coil and converts a current flowing via the detection coil into a voltage output; a peak detecting unit that detects a peak value of the output voltage output from the current detecting unit; an adding unit that outputs a difference value between a predetermined target value and the peak value; and a current regulating unit that regulates the current flowing in the detection coil based on an output of the adding unit, wherein a feedback loop is made up of the current detecting unit, the peak detecting unit, the adding unit, and the current regulating unit, and the zero-phase current is detected based on the output of the adding unit obtained when an output of the peak detecting unit is regulated so as to be the target value under the control of the feedback loop.

Effect of the Invention

In the zero-phase current detecting apparatus according to the present invention, a feedback loop is made up of the current detecting unit, the peak detecting unit, the adding unit, and the current regulating unit. A zero-phase current is detected based on an output of the adding unit obtained when an output of the peak detecting unit is regulated so as to be equal to the target value under the control of the feedback loop. Thus, an advantageous effect is achieved where it is possible to provide a zero-phase current detecting apparatus that makes it possible to prevent degradation in the level of precision in the detection process without increasing the costs.

BRIEF DESCRIPTION OF DRAWINGS

[FIG.] FIG. 1 is a functional block diagram of a zero-phase current detecting apparatus according to a first embodiment of the present invention.

[FIG.] FIG. 2 is a diagram of an exemplary circuit configuration of the zero-phase current detecting apparatus according to the first embodiment of the present invention to materialize the functional configuration shown in FIG. 1.

[FIG.]

[FIG.]

[FIG.] FIG. 5-1 is a waveform diagram of the output of a current detector when no zero-phase current is flowing.

[FIG.] FIG. 5-2 is a waveform diagram of the output of the current detector when a zero-phase current is flowing.

[FIG.]

[FIG.]

[FIG.]

[FIG.]

[FIG.]

[FIG.]

[FIG.]

[FIG.]

[FIG.]

[FIG.]

[FIG.]

[FIG.]

[FIG.]

EXPLANATIONS OF LETTERS OR NUMERALS

Figure 3:
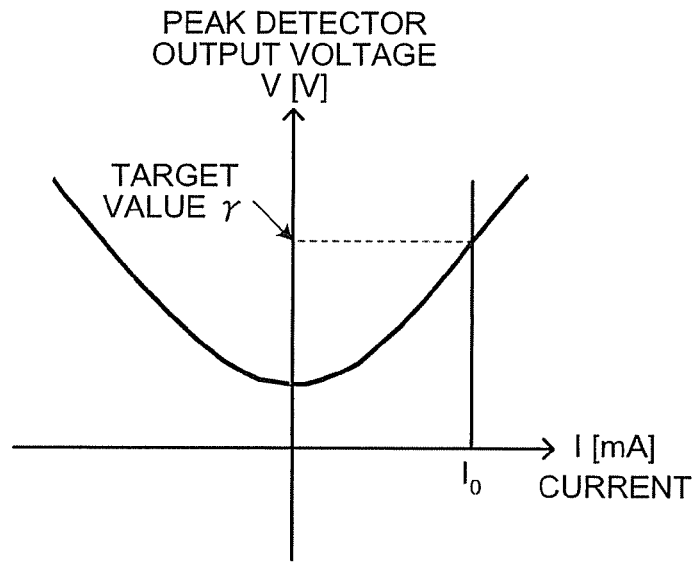
FIG. 3 is a graph for explaining a relationship between a current that flows in a detection coil and a voltage output from a peak detecting circuit (when no zero-phase current flows).

ZCT: zero-phase-sequence current transformer
10: electric power line
11: pulse generating unit
11a: pulse generator
12: current detecting unit
12a: current detector
12b: resistor
14: detection coil
15: peak detecting unit
15a: peak detecting circuit
18: adding unit
20: current regulating unit
21: proportional integral controller
25: target value
25a: target value output circuit
26: output terminal
30: control polarity reversal preventing unit
30a: control polarity reversal preventing circuit
32: magnetization forcing unit
32a: magnetization forcing circuit
32b: magnetization instruction generator
34: high frequency passing unit
36: time constant changing unit

BEST MODE(S) FOR CARRYING OUT THE INVENTION

Exemplary embodiments of a zero-phase current detecting apparatus according to the present invention will be explained in detail with reference to the accompanying drawings. It should be noted that the present invention is not limited to these exemplary embodiments.

First Embodiment

Figures 1, 5:
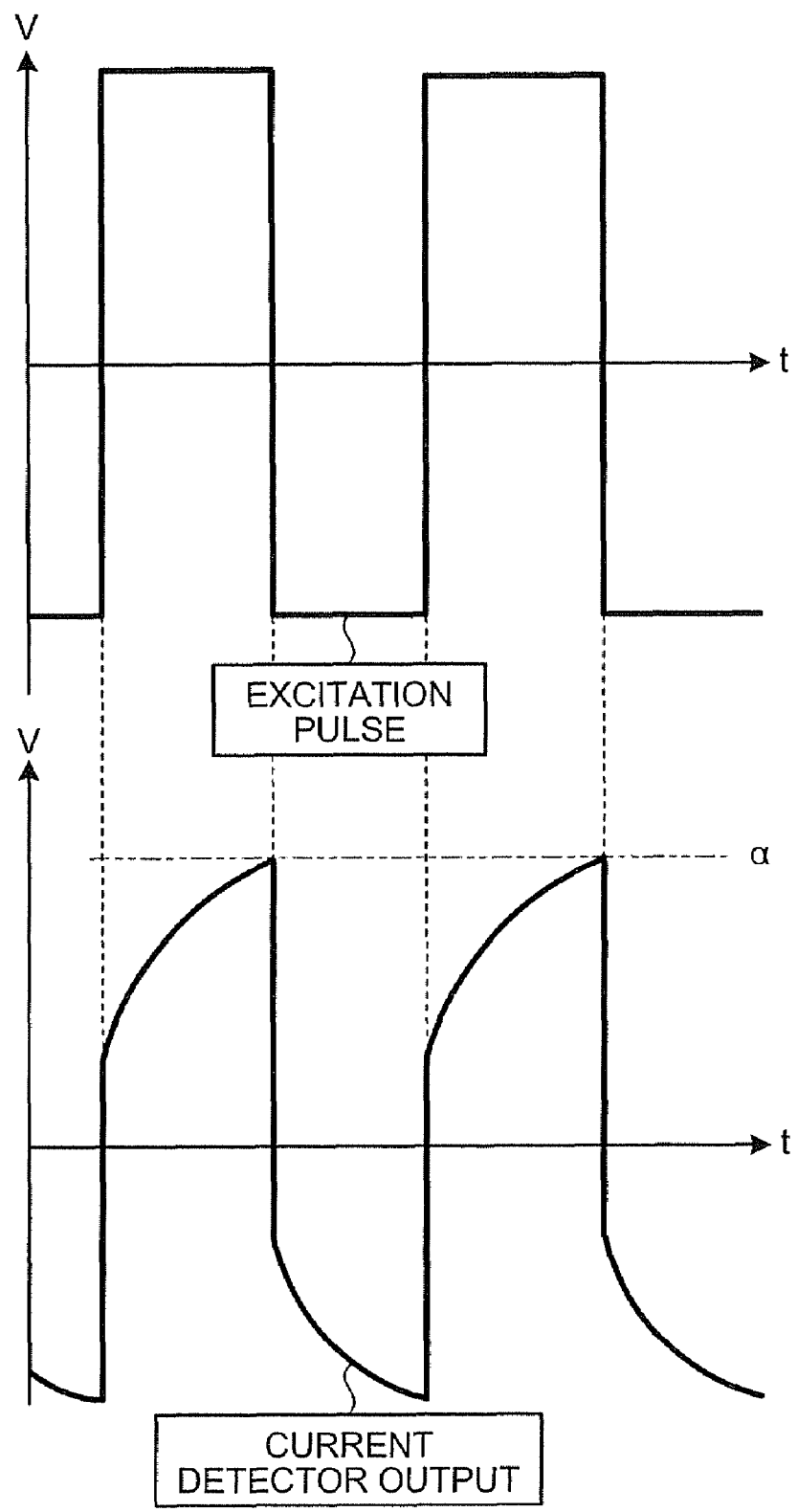

FIG. 1 is a functional block diagram of a zero-phase current detecting apparatus according to a first embodiment of the present invention. As shown in the drawing, the zero-phase current detecting apparatus according to the first embodiment is configured so as to include a zero-phase-sequence current transformer ZCT, a pulse generating unit 11, a current detecting unit 12, a peak detecting unit 15, an adding unit 18, and a current regulating unit 20.

Next, a connection configuration of the zero-phase current detecting apparatus shown in FIG. 1 will be explained. In the drawing, an electric power line 10, which is a detection target for detecting whether a zero-phase current flows in it, is inserted through the zero-phase-sequence current transformer ZCT. The zero-phase-sequence current transformer ZCT includes a detection coil 14 that is wound around a detection core. The pulse generating unit 11 is connected to one end of the detection coil 14. The current detecting unit 12 is connected to the other end of the detection coil 14. The output of the current detecting unit 12 serves as an input signal to the peak detecting unit 15. The output of the peak detecting unit 15 serves as an input signal to the adding unit 18. In addition to the output of the peak detecting unit 15, a predetermined target value 25 is input to the adding unit 18. An output of the adding unit 18 is configured into an output terminal ("OUT PUT") 26 of the zero-phase current detecting apparatus according to this embodiment and also serves as an input signal to the current regulating unit 20. The output of the current regulating unit 20 is input to an input terminal of the current detecting unit 12 while acting on the current detecting unit 12 or the detection coil 14. In the zero-phase current detecting apparatus according to this embodiment, as a result of the connections as described above, a feedback loop is made up of the current detecting unit 12, the peak detecting unit 15, the adding unit 18, and the current regulating unit 20, and the output of the adding unit 18 is output from the output terminal 26 as the output of the zero-phase current detecting apparatus.

Figures 2, 5:
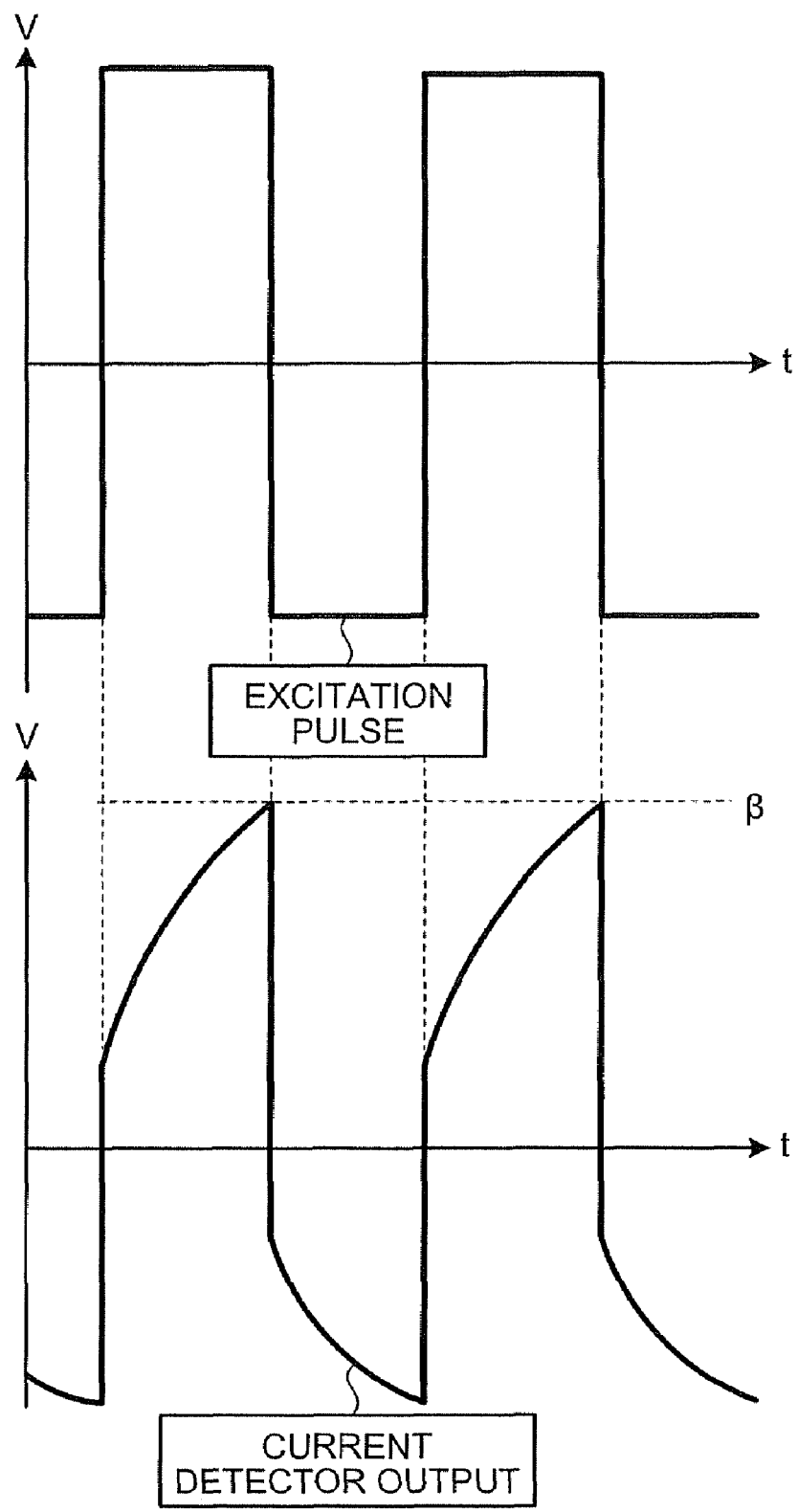

FIG. 2 is a diagram of an exemplary circuit configuration of the zero-phase current detecting apparatus according to the first embodiment of the present invention to materialize the functional configuration shown in FIG. 1. In FIG. 2, a pulse generator 11a corresponds to the pulse generating unit 11 shown in FIG. 1. Similarly, a current detector 12a corresponds to the current detecting unit 12 and the current regulating unit 20. A peak detecting circuit 15a corresponds to the peak detecting unit 15. A proportional integral controller 21 corresponds to the adding unit 18. A target value output circuit 25a corresponds to the target value 25. It is possible to configure the current detector 12a by using a single resistor 12b, as shown in the drawing. It is possible to configure the peak detecting circuit 15a by combining circuit elements such as an operational amplifier, a resistor, a capacitor, and a diode, as shown in the drawing. It is possible to configure the target value output circuit 25a by using, for example, two resistors, as shown in the drawing. It is possible to configure the proportional integral controller 21 by combining circuit elements such as an operational amplifier, a resistor, and a capacitor, as shown in the drawing. In this manner, the current detector 12a has the function of the current regulating unit 20, in addition to the function of the current detecting unit 12. The details of the functions of the current detector 12a will be explained later.

Figure 4:
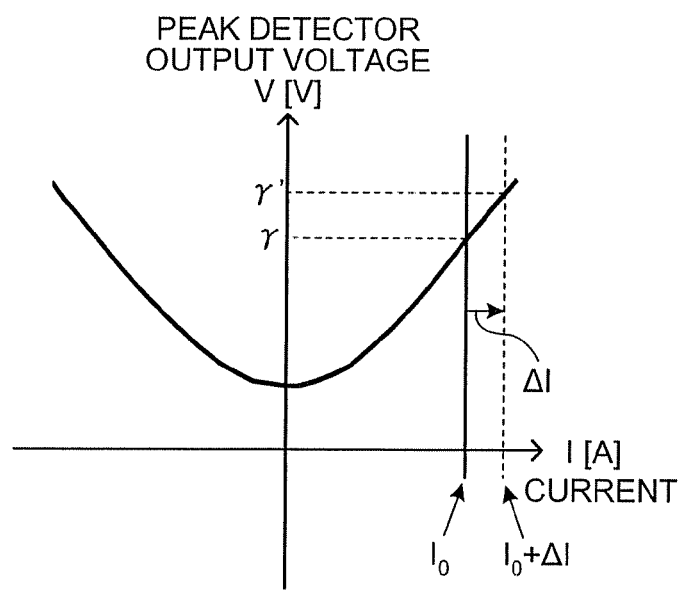
FIG. 4 is a graph for explaining a relationship between a current that flows in the detection coil and a voltage output from the peak detecting circuit (when a zero-phase current flows).

Next, the operation of the zero-phase current detecting apparatus according to the first embodiment will be explained, with reference to FIGS. 2 to 5. FIGS. 3 and 4 are graphs for explaining a relationship between a current that flows in the detection coil 14 and an output voltage of the peak detecting circuit 15a. In FIG. 3, a situation in which no zero-phase current is flowing in the electric power line 10 is shown. Conversely, in FIG. 4, a situation in which a zero-phase current is flowing in the electric power line 10 is shown. FIG. 5-1 is an output waveform of the current detector 12a in a situation where no zero-phase current is flowing. FIG. 5-2 is an output waveform of the current detector 12a in a situation where a zero-phase current is flowing.

In FIG. 2, an excitation pulse signal generated by the pulse generator 11a is input to one end of the detection coil 14 included in the zero-phase-sequence current transformer ZCT through which the electric power line 10 is inserted. As a result, the detection core (not shown) of the zero-phase-sequence current transformer ZCT is in an excited state. On the other hand, a zero-phase current flowing in the electric power line 10 is detected by the detection coil 14. The current detector 12a connected to the zero-phase-sequence current transformer ZCT converts the current flowing in the detection coil 14 into a voltage. The voltage output from the current detector 12a is input to the peak detecting circuit 15a. The peak detecting circuit 15a detects a peak value of the output of the current detector 12a and outputs the detected peak value.

The output of the peak detecting circuit 15a is input to one of input terminals (i.e., the reversal input terminal) of the proportional integral controller 21. A target value γ set by the target value output circuit 25a is input to the other of the input terminals (i.e., the non-reversal input terminal) of the proportional integral controller 21. The proportional integral controller 21 performs a proportional integral computation by using the difference between the target value γ and the output of the peak detecting circuit 15a as an input signal. A proportional integral output is input to the current detector 12a.

Next, the function of the current detector 12a will be explained. As explained above, the current detector 12a converts the current flowing in the detection coil 14 into a voltage and outputs the voltage. In other words, the current detector 12a has the function to detect the current flowing in the zero-phase-sequence current transformer ZCT. On the other hand, if we take a look at the connection of the resistor 12b that is included in the current detector 12a, the output of the proportional integral controller 21 is connected to a terminal (a second end) of the resistor 12b that is different from a connection terminal (a first end) being connected to the detection coil 14 included in the zero-phase-sequence current transformer ZCT. Because of this connection state, the output of the proportional integral controller 21 has an action to change the electric potential of the second end side of the resistor 12b that is used as a reference for the output of the current detector 12a (i.e., the output to the peak detecting circuit 15a). It is also acceptable to consider that this action is caused by a decrease in the voltage detected by the current detector 12a because a current that corresponds to the output of the proportional integral controller 21 flows toward the pulse generator 11a via the detection coil 14. In any case, the current detector 12a also has the current regulating function to regulate the current flowing in the detection coil 14, as shown in the functional diagram in FIG. 1. It is also acceptable to consider that this current regulating function is realized by collaboration between the current detector 12a and the proportional integral controller 21 shown in FIG. 2.

Returning to the description of FIG. 2, a feedback loop is made up of the current detector 12a, the peak detecting circuit 15a, the target value output circuit 25a, and the proportional integral controller 21. The difference between the output of the peak detecting circuit 15a and the target value γ is subjected to feedback control by the feedback loop and regulated so that the output of the peak detecting circuit 15a is always equal to the target value γ. In other words, when the output of the peak detecting circuit 15a is expressed as η, the feedback control is exercised so that η=γ is always satisfied.

The state in this situation is shown in FIG. 3. In FIG. 3, the vertical axis shows the voltage output from the peak detecting circuit 15a, while the horizontal axis shows the current flowing in the current detector 12a (the detection coil 14). As explained above, while the output η of the peak detecting circuit 15a is controlled so as to be equal to the target value γ, the current flows taking a course as follows: the proportional integral controller 21→the current detector 12a →the zero-phase-sequence current transformer ZCT. This situation is the same as a state in which a zero-phase current $I_0$ is equivalently flowing in the electric power line 10.

From the situation shown in FIG. 3, if a zero-phase current ΔI flows in the electric power line 10, the current flowing in the current detector 12a via the detection coil 14 has a tendency to change from $I_0$ to $I_0+\Delta I$, and also, the output of the peak detecting circuit 15a has a tendency to change from γ to γ', as shown with broken lines in FIG. 4. However, because the proportional integral controller 21 gives feedback of a control amount based on the difference between the target values γ and γ' to the current detector 12a, the output of the peak detecting circuit 15a is arranged so as to be always equal to the target value γ. As a result, the output of the peak detecting circuit 15a is always constant regardless of the level of the zero-phase current flowing in the electric power line 10. Also, the zero-phase current flowing in the electric power line 10 is offset by a compensating current (having the same level as ΔI and being in a direction opposite to the direction of ΔI) that is caused to flow in the zero-phase-sequence current transformer ZCT by a change in the output of the current detector 12a. Thus, the current that flows in the detection coil is constant and remains to be $I_0$. Consequently, the flux in the detection core included in the zero-phase-sequence current transformer ZCT is maintained to be constant.

Next, the voltage output from the current detector 12a, i.e., the voltage output from the present apparatus will be explained. First, when no zero-phase current is flowing in the electric power line 10, the output waveform of the current detector 12a changes according to the excitation pulse signal generated by the pulse generator 11a in the manner shown in the lower half of FIG. 5-1. In this situation, the peak detecting circuit 15a detects a peak value α of the output of the current detector. On the other hand, when a zero-phase current flows in the electric power line 10, the current flowing in the detection coil 14 maintains the constant value, as explained above; however, the electric potential at the other end of the current detector 12a, i.e., the output of the current detector 12a, changes as shown in FIG. 5-2. When the output of the peak detecting circuit 15a at that time is expressed as β, the value of β is positively correlated with the level of the zero-phase current flowing in the electric power line 10. Accordingly, it is possible to output the value of the zero-phase current flowing in the electric power line 10, based on a difference between the value of α and the value of β.

Figure 6:
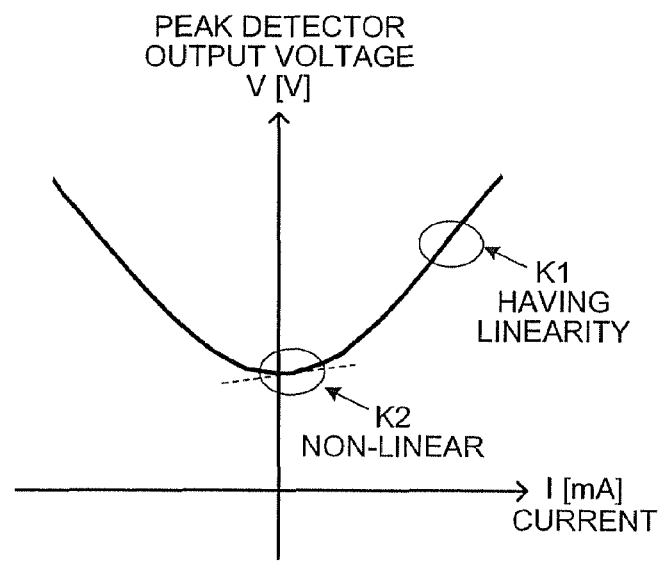
FIG. 6 is a graph of the detection characteristic of the peak detecting circuit.

Next, the current value (corresponding to $I_0$ above) that is caused to flow in the detection coil 14 in advance will be explained. FIG. 6 is a graph for explaining the detection characteristic of the peak detecting circuit 15a. When a predetermined current is caused to flow in the detection coil 14 in advance (corresponding to the situation shown in FIG. 4 in which the current $I_0$ is caused to flow in the detection coil 14), the detection characteristic of the peak detecting circuit 15a have linearity in the area K1 in the drawing. Thus, it is possible to achieve a high level of precision in the detection process. On the other hand, when the level of the current caused to flow in the detection coil 14 is small, the detection characteristic of the peak detecting circuit 15a is non-linear in the area K2 in the drawing. Thus, it is difficult to keep the level of precision in the detection process high. Accordingly, it is desirable to set the target value γ being output by the target value output circuit 25a to be at such a level that the output of the peak detecting circuit 15a keeps its linearity. By setting the target value γ at such a level, it is possible to detect the zero-phase current with a high level of precision.

According to the first embodiment, the proportional integral controller 21 shown in FIG. 2 is used as the adding unit 18 shown in FIG. 1. However, when the gain of the proportional integral controller 21 is not so large, it is acceptable to use a proportional controller that includes no capacitor in the feedback portion.

Second Embodiment

Figure 7:
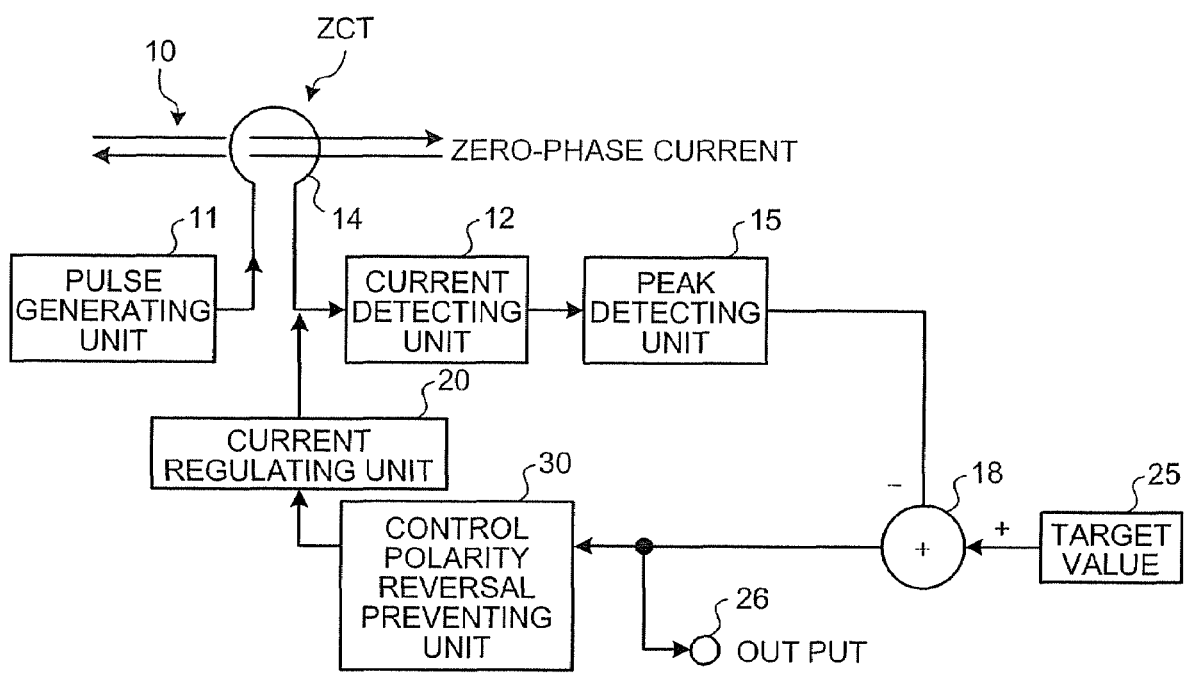
FIG. 7 is a functional block diagram of a zero-phase current detecting apparatus according to a second embodiment of the present invention.

FIG. 7 is a functional block diagram of a zero-phase current detecting apparatus according to a second embodiment of the present invention. As shown in the drawing, in the zero-phase current detecting apparatus according to the second embodiment, the configuration of the zero-phase current detecting apparatus shown in FIG. 1 is used as the base. In addition, the zero-phase current detecting apparatus further includes a control polarity reversal preventing unit 30 provided between the adding unit 18 and the current regulating unit 20. The control polarity reversal preventing unit 30 has a function (called an operation range limiting function) to prevent the operating point of the peak detecting unit 15 from going out of a control range so that the detection core included in the zero-phase-sequence current transformer ZCT does not become saturated. Other configurations of the zero-phase current detecting apparatus according to the second embodiment are the same as or similar to the configuration of the zero-phase current detecting apparatus according to the first embodiment shown in FIG. 1. The constituent elements in the same or similar configurations will be referred to by using the same reference characters, and the explanation thereof will be omitted.

Figure 8:
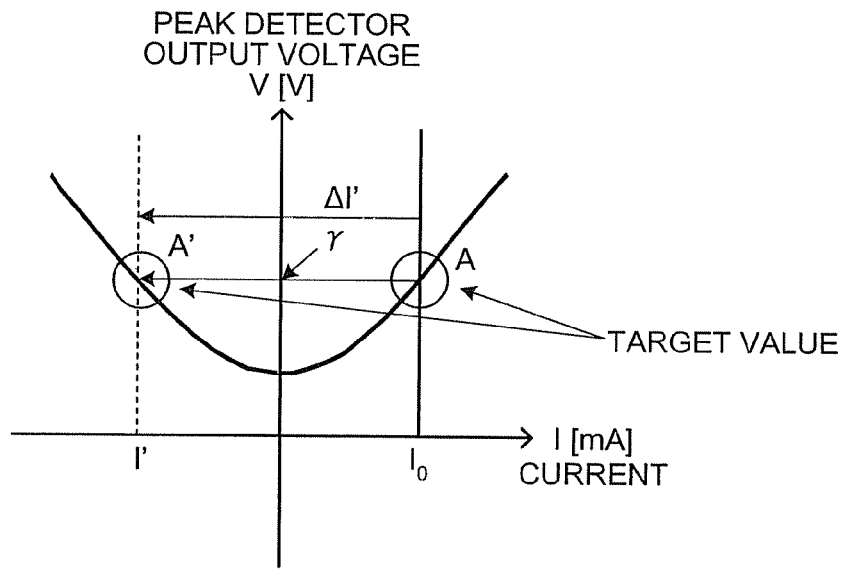
FIG. 8 is a graph for explaining the function of a control polarity reversal preventing unit.

FIG. 8 is a graph for explaining the function of the control polarity reversal preventing unit 30. As explained above, when the output of the peak detecting unit 15 is larger than the target value γ, the output of the peak detecting unit 15 changes so as to become equal to the target value γ. This situation is equivalent to a situation obtained when a negative zero-phase current is caused to flow in the zero-phase-sequence current transformer ZCT. Also, when the output of the peak detecting unit 15 is smaller than the target value γ, the output of the peak detecting unit 15 changes so as to equal to the target value γ. This situation is equivalent to a situation obtained when a positive zero-phase current is caused to flow in the zero-phase-sequence current transformer ZCT.

On the other hand, if a large zero-phase current flows in this situation, the current that flows in the current detecting unit 12 (i.e., the detection coil 14) is reversed, as shown in FIG. 8. As a result, the operating point at which the target value γ is output moves from the point A (the current value $I_0$) to the point A' (the current value I'). In this situation, when the output of the peak detecting unit 15 is larger than the target value γ, the output of the peak detecting unit 15 changes so as to become equal to the target value γ. This operation is equivalent to an action of causing a large negative zero-phase current corresponding to ΔI' shown in FIG. 8 to flow in the zero-phase-sequence current transformer ZCT. Thus, the operation is out of a normal control range, and the detection core included in the zero-phase-sequence current transformer ZCT becomes saturated.

Generally speaking, a situation rarely occurs in which the operation is out of the control range because of a large zero-phase current. However, if a large zero-phase current should flow by any chance, there is a possibility that the operation goes out of the control range assumed by the zero-phase current detecting apparatus according to the present invention.

To cope with this problem, according to the second embodiment, the control polarity reversal preventing unit 30 is provided between the adding unit 18 and the current regulating unit 20.

Figure 9:
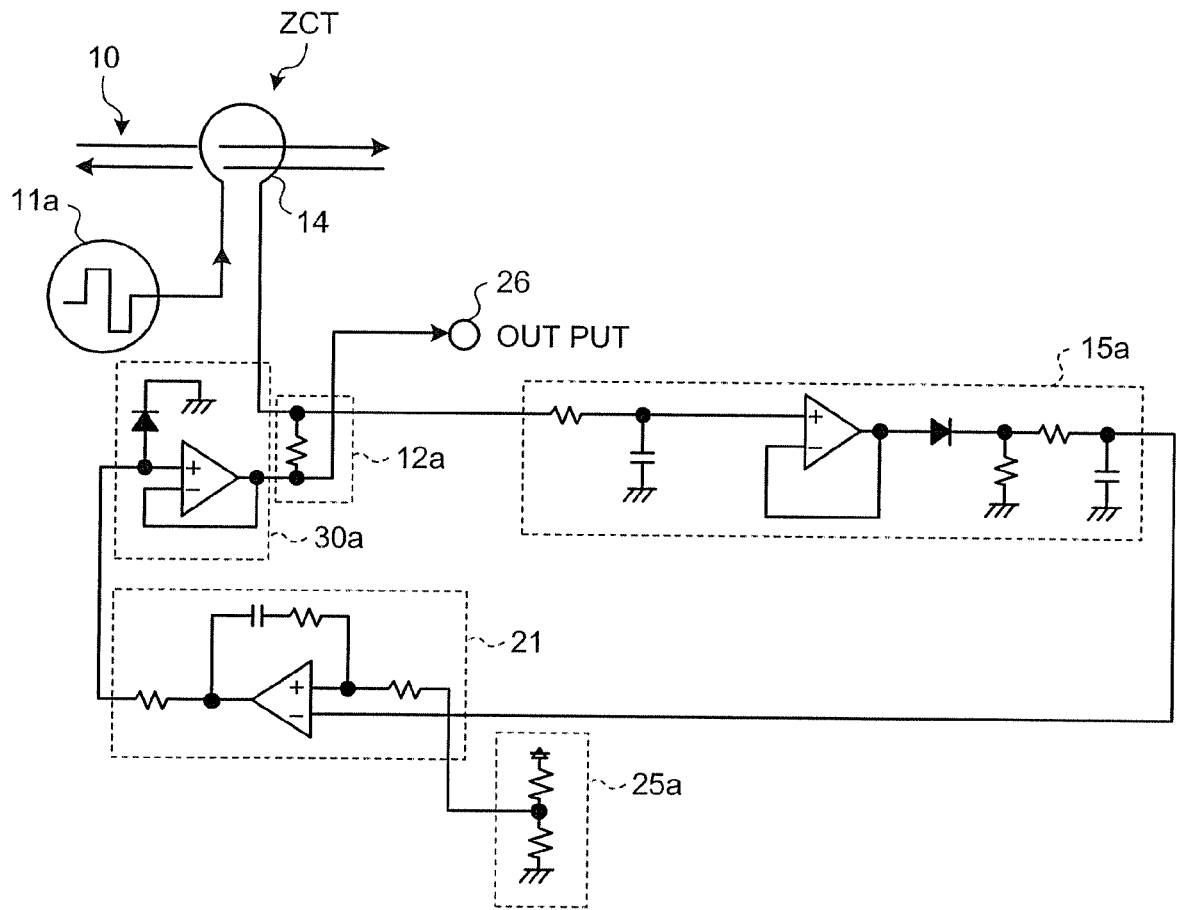
FIG. 9 is a diagram of an exemplary circuit configuration of the zero-phase current detecting apparatus according to the second embodiment of the present invention to materialize the functional configuration shown in FIG. 7.

FIG. 9 is a diagram of an exemplary circuit configuration of the zero-phase current detecting apparatus according to the second embodiment of the present invention to materialize the functional configuration shown in FIG. 7. In the configuration shown in FIG. 9, a control polarity reversal preventing circuit 30a is provided as a constituent element that corresponds to the control polarity reversal preventing unit 30 shown in FIG. 7. It is possible to configure the control polarity reversal preventing circuit 30a by combining circuit elements such as an operational amplifier and a diode as shown in the drawings. Other constituent elements are the same as the ones in the circuit configuration shown in FIG. 2. Those constituent elements will be referred to by using the same reference characters, and the explanation thereof will be omitted.

In FIG. 9, the output of the proportional integral controller 21 serves an input signal to the control polarity reversal preventing circuit 30a and is input to a non-reversal input terminal of the operational amplifier. The non-reversal input terminal of the operational amplifier is connected to a ground via the diode. Thus, even if a current that exceeds the control range limit value flows on the primary side (i.e., the electric power line 10) of the zero-phase-sequence current transformer ZCT, the output of the proportional integral controller 21 is input to the current detector 12a after being clipped based on the control range limit value determined by the circuit elements of the control polarity reversal preventing circuit 30a. Consequently, even if a large zero-phase current should flow, the detection core included in the zero-phase-sequence current transformer ZCT is prevented from becoming saturated. It is therefore possible to detect the zero-phase current with a high level of precision.

Third Embodiment

Figure 10:
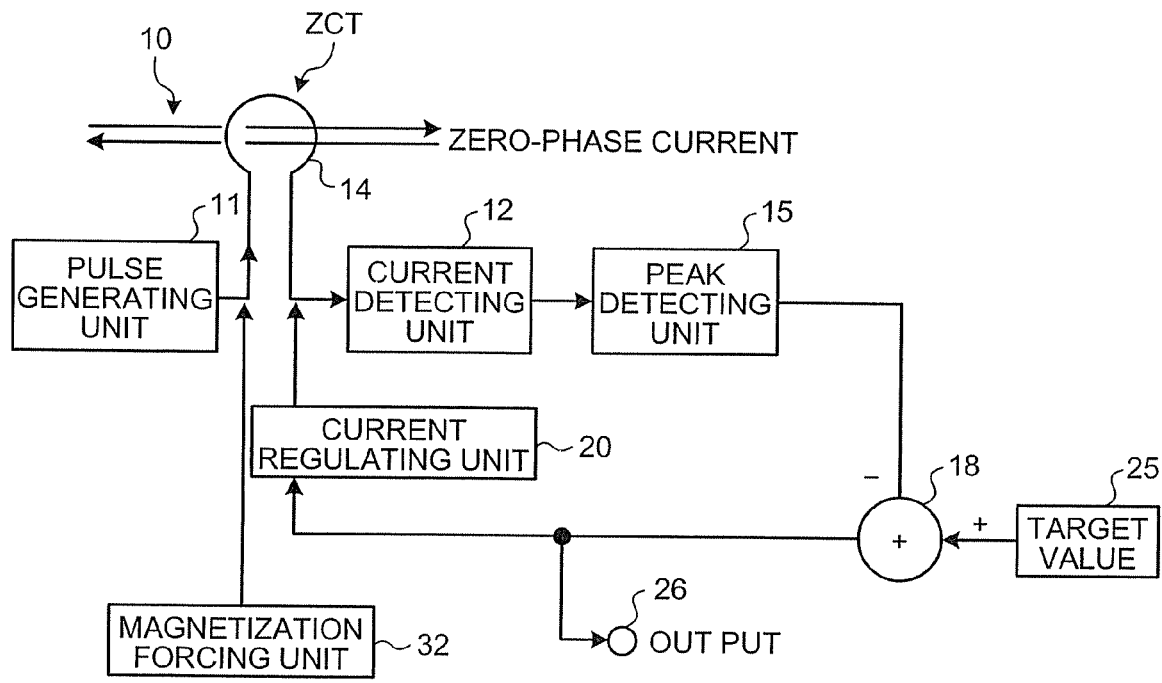
FIG. 10 is a functional block diagram of a zero-phase current detecting apparatus according to a third embodiment of the present invention.

FIG. 10 is a functional block diagram of a zero-phase current detecting apparatus according to a third embodiment of the present invention. As shown in the drawing, in the zero-phase current detecting apparatus according to the third embodiment, the configuration of the zero-phase current detecting apparatus shown in FIG. 1 is used as the base. In addition, the zero-phase current detecting apparatus further includes a magnetization forcing unit 32 that acts on the current detecting unit 12 or the detection coil 14. The magnetization forcing unit 32 has a function to exercise control so that the detection core included in the zero-phase-sequence current transformer ZCT is in a predetermined magnetized state. Other configurations of the zero-phase current detecting apparatus according to the third embodiment are the same as or similar to the configuration of the zero-phase current detecting apparatus according to the first embodiment shown in FIG. 1. The constituent elements in the same or similar configurations will be referred to by using the same reference characters, and the explanation thereof will be omitted.

Figure 11:
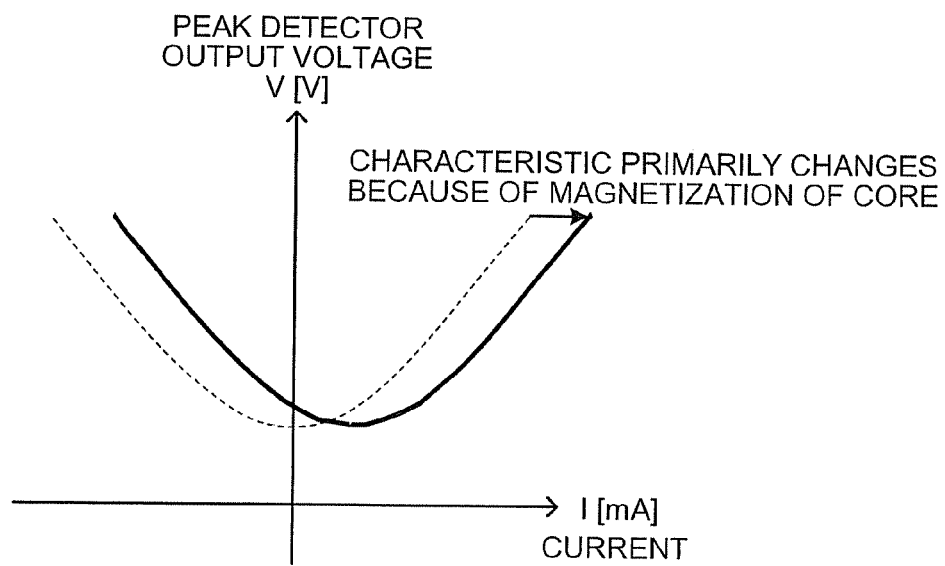
FIG. 11 is a graph for explaining a function of a magnetization forcing unit.

FIG. 11 is a graph for explaining the function of the magnetization forcing unit 32. As explained above, in the zero-phase current detecting apparatus according to the first or the second embodiment, the current regulating unit 20 operates so as to exercise control in such a manner that the current flowing in the detection coil is constant. However, when a zero-phase current flows in the electric power line 10, the magnetic flux within the detection core included in the zero-phase-sequence current transformer ZCT changes. After the magnetic flux has changed repeatedly, the magnetized state of the detection core also changes. If the magnetized state of the detection core changes, the output characteristic of the peak detecting unit 15 changes, for example, from the one shown with a broken line to the one shown with a solid line, as shown in FIG. 11. Thus, there is a possibility that the level of precision in the detection process is lowered.

To cope with this problem, according to the third embodiment, the magnetization forcing unit 32 that acts on the current detecting unit 12 or the detection coil 14 is provided, as explained above.

Figure 12:
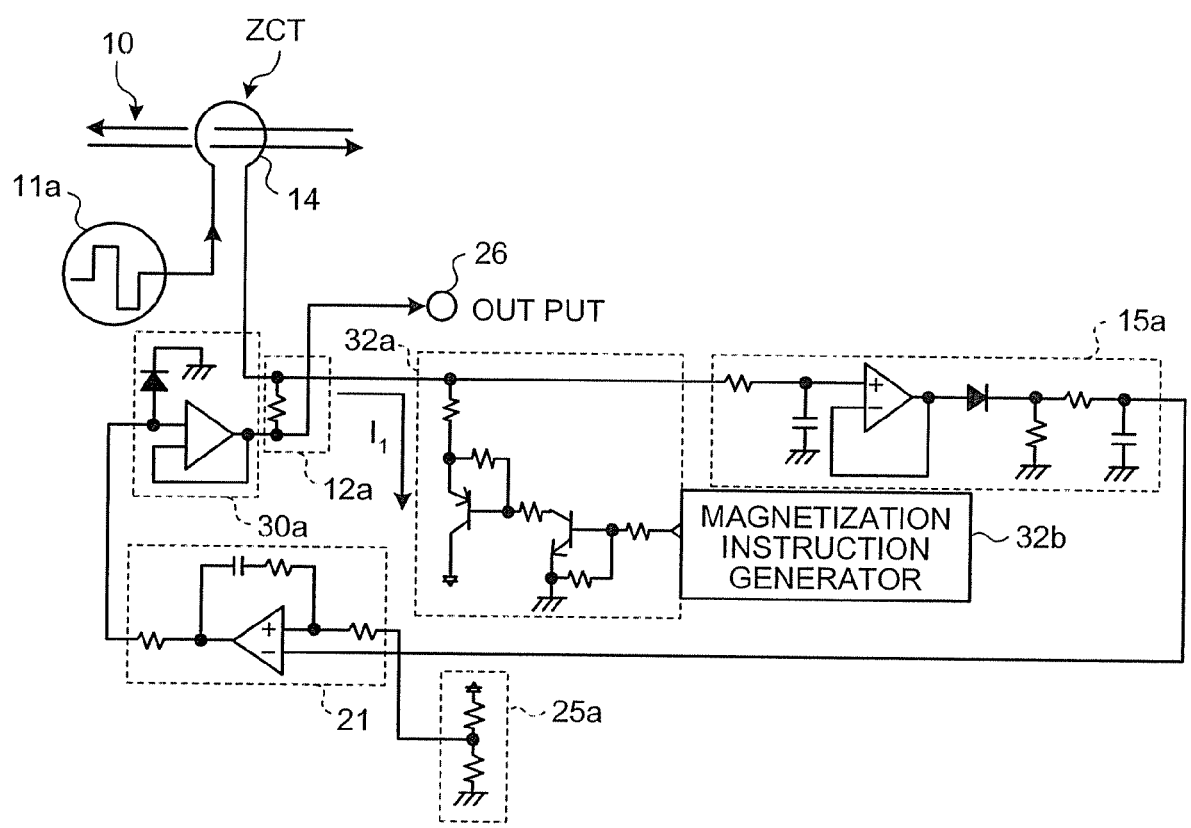
FIG. 12 is a diagram of an exemplary circuit configuration of the zero-phase current detecting apparatus according to the third embodiment of the present invention to materialize the functional configuration shown in FIG. 10.

FIG. 12 is a diagram of an exemplary circuit configuration of the zero-phase current detecting apparatus according to the third embodiment of the present invention to materialize the functional configuration shown in FIG. 10. In FIG. 12, the control polarity reversal preventing circuit 30a shown in FIG. 9 is also provided at the same time. However, needless to say, it is acceptable to use a configuration in which the control polarity reversal preventing circuit 30a is not included.

In FIG. 12, a magnetization forcing circuit 32a and a magnetization instruction generator 32b that controls the magnetization forcing circuit 32a are provided as constituent elements that correspond to the magnetization forcing unit 32 shown in FIG. 10. It is possible to configure the magnetization forcing circuit 32a by combining circuit elements such as a transistor and a resistor as shown in the drawing. It is possible to configure the magnetization instruction generator 32b by using a digital processor such as a microcomputer. Other constituent elements are the same as the ones in the circuit configuration shown in FIG. 9. Those constituent elements will be referred to by using the same reference characters, and the explanation thereof will be omitted.

As shown in FIG. 12, the magnetization forcing circuit 32a brings the current flowing in the detection coil 14 into the magnetization forcing circuit 32a (when $I_1>0$) or sends a current into the detection coil 14 (when $I_1<0$), based on the control of the magnetization instruction generator 32b. In other words, the magnetization instruction generator 32b exercises control so that the magnetized state of the detection core included in the zero-phase-sequence current transformer ZCT maintains a predetermined state (for example, the state obtained at a reference point in time) by regulating the magnetizing current $I_1$ that is caused to flow in the detection coil 14 via the magnetization forcing circuit 32a. Accordingly, in the zero-phase current detecting apparatus according to the third embodiment, because the magnetized state of the detection core included in the zero-phase-sequence current transformer ZCT is stabilized, changes in the output characteristic of the peak detecting unit 15 are inhibited. Thus, it is possible to detect the current with a high level of precision, without receiving any influence from external magnetizing factors.

It is acceptable to configure the magnetization instruction generator 32b by using a controller other than a microcomputer. It should be noted, however, that by configuring the magnetization instruction generator 32b by using a microcomputer, it is possible to exercise control in a finely-tuned manner with regard to magnetization instructions (e.g. magnetization periods and magnetization timing) and the like. Thus, it is possible to detect the current with an even higher level of precision.

In the configuration described above, the magnetizing current $I_1$ that is caused to flow in the detection coil 14 is regulated via the magnetization forcing circuit 32a; however, another arrangement is also acceptable in which a secondary coil (i.e., a magnetization control coil) that is different from the detection coil 14 is provided so that the magnetizing current $I_1$ is caused to flow in the magnetization control coil.

Yet another arrangement is also acceptable in which a control line that is different from the electric power line 10 is inserted through the detection core included in the zero-phase-sequence current transformer ZCT so that the magnetizing current is caused to flow in the control line. temporarily When a method that employs the detection coil or a secondary coil such as the magnetization control coil is used, the current level proportional to the ratio of the number of turns of the coil is considered to be equivalent to the level of a current flowing through the detection core included in the zero-phase-sequence current transformer ZCT. Thus, it is possible to make the current used in the magnetization control smaller.

Also, when a method that employs such a secondary coil is used, if an exclusive-use coil such as the magnetization control coil is employed, it is possible to exercise control simultaneously and independently so that the output voltage of the peak detecting circuit is stabilized, and also the magnetized state of the detection core included in the zero-phase-sequence current transformer ZCT is stabilized. Thus, it is possible to maintain the ease with which the control is exercised. Consequently, it is possible to exercise control with an even higher level of precision.

On the other hand, when a method that employs such a secondary coil is used, if the detection coil is employed, it is possible to use a general-purpose zero-phase-sequence current transformer ZCT. Thus, it is possible to configure the zero-phase current detecting apparatus at a low cost.

In addition, when the method in which a current is caused to flow on the primary side of the zero-phase-sequence current transformer ZCT is used, it is also possible to use a general-purpose zero-phase-sequence current transformer ZCT. Thus, it is possible to configure the zero-phase current detecting apparatus at a low cost.

Fourth Embodiment

Next, a zero-phase current detecting apparatus according to a fourth embodiment of the present invention will be explained. The zero-phase current detecting apparatus according to the fourth embodiment is characterized in that it provides a control method to maintain detection performances with an even higher level of precision by appropriately controlling the magnetizing current applied to the detection core included in the zero-phase-sequence current transformer ZCT so as to prevent the detection core included in the zero-phase-sequence current transformer ZCT from becoming saturated. The zero-phase current detecting apparatus according to the fourth embodiment may have a configuration similar to that of the zero-phase current detecting apparatus according to the third embodiment.

Based on the configuration of the zero-phase current detecting apparatus according to the third embodiment, let us discuss a situation in which a magnetizing current is forcibly caused to flow in a predetermined coil so that the magnetized state of the detection core included in the zero-phase-sequence current transformer ZCT can be controlled. In this situation, the detection core included in the zero-phase-sequence current transformer ZCT may become saturated, depending on the current amount of the magnetizing current that is forcibly caused to flow. In such a situation, it is difficult to detect a zero-phase current. Accordingly, to prevent the detection core included in the zero-phase-sequence current transformer ZCT from becoming saturated, it is necessary to control the current amount of the magnetizing current so as to be at an appropriate level.

For example, it is desirable to continuously perform an operation to cause a magnetizing pulse current to flow (hereinafter, "magnetizing operation") for a short period of time. By exercising control this way, it is possible to prevent the detection core included in the zero-phase-sequence current transformer ZCT from becoming saturated and to perform the detection process with an even higher level of precision.

Also, when the magnetizing operation is continuously performed for a short period of time as described above, it is desirable to cause the magnetizing pulse current to flow in synchronization with an excitation pulse. When the magnetizing pulse current is not in synchronization with an excitation pulse, the state of the magnetic flux of the detection core included in the zero-phase-sequence current transformer ZCT during a cycle period in which the magnetizing operation is performed is different from the state of the magnetic flux during a cycle period in which no magnetizing operation is performed. Thus, the output of the peak detecting circuit is not stable. However, if the magnetizing operation is performed in synchronization with the excitation pulse, it is possible to stabilize the operation of the peak detecting circuit.

Accordingly, by performing the magnetizing operation one or more times in every excitation cycle period, it is possible to exercise control so that the magnetized state of the detection core included in the zero-phase-sequence current transformer ZCT maintains the predetermined state. Thus, it is possible to maintain a stable magnetized state.

It is preferable to have an arrangement so that the length of the period in which the magnetizing operation is performed for a short period of time is equal to or shorter than 20% of the excitation cycle period (more preferably, equal to or shorter than 5% of the excitation cycle period) and also so that one output is made in every excitation cycle period. With this arrangement, it is possible to prevent the detection core included in the zero-phase-sequence current transformer ZCT from becoming saturated and to perform the detection process with an even higher level of precision.

Figure 13:
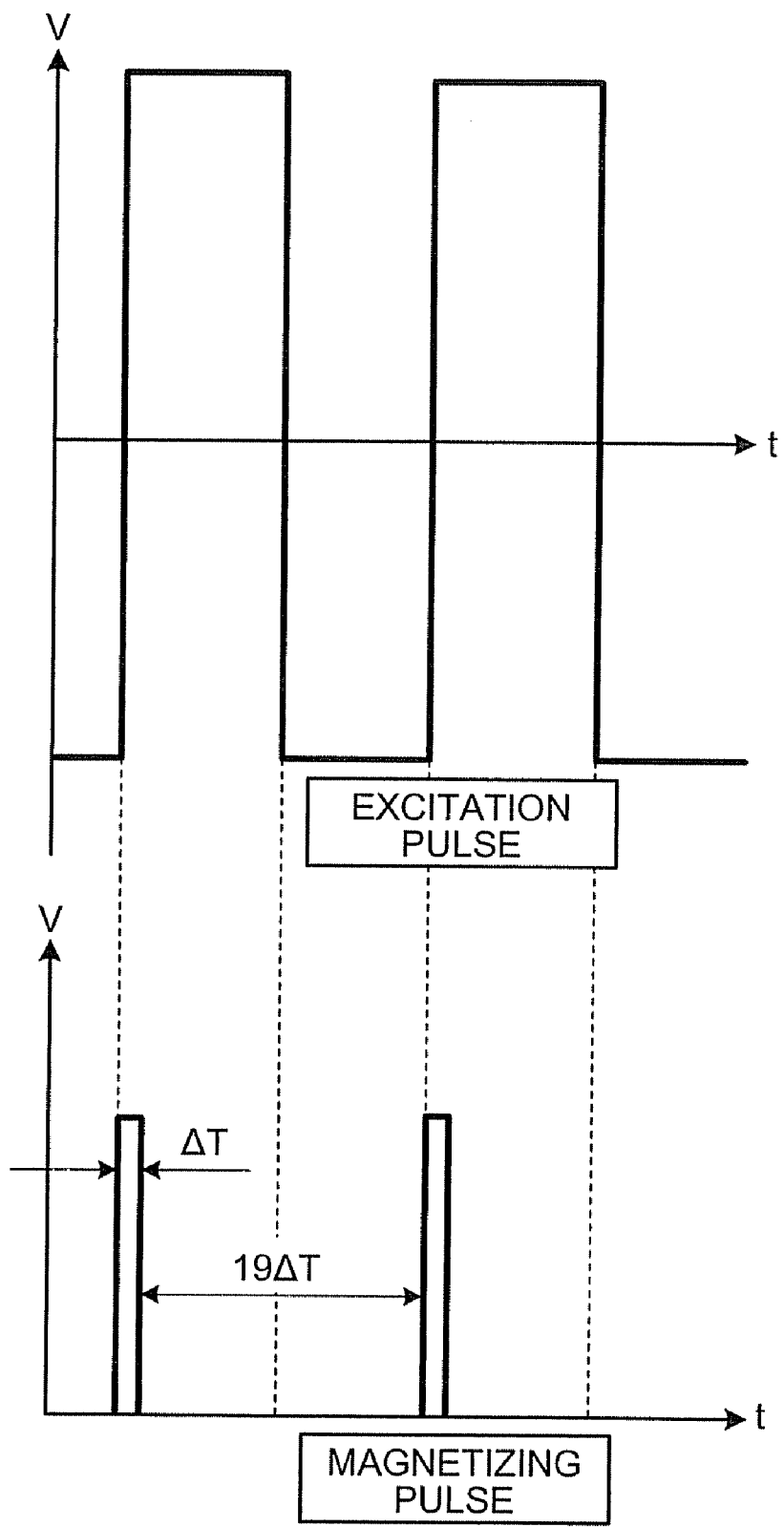
FIG. 13 is a graph of an exemplary embodiment for explaining an operation of a zero-phase current detecting apparatus according to a fourth embodiment of the present invention.

For example, as shown in FIG. 13, by having an arrangement so that the magnetizing pulse is in synchronization with the excitation pulse and so that the cycle period of the magnetizing pulse is 5% of the excitation cycle period, it is possible to maintain a stable magnetized state and to perform the detection process with a high level of precision.

Fifth Embodiment

Figure 14:
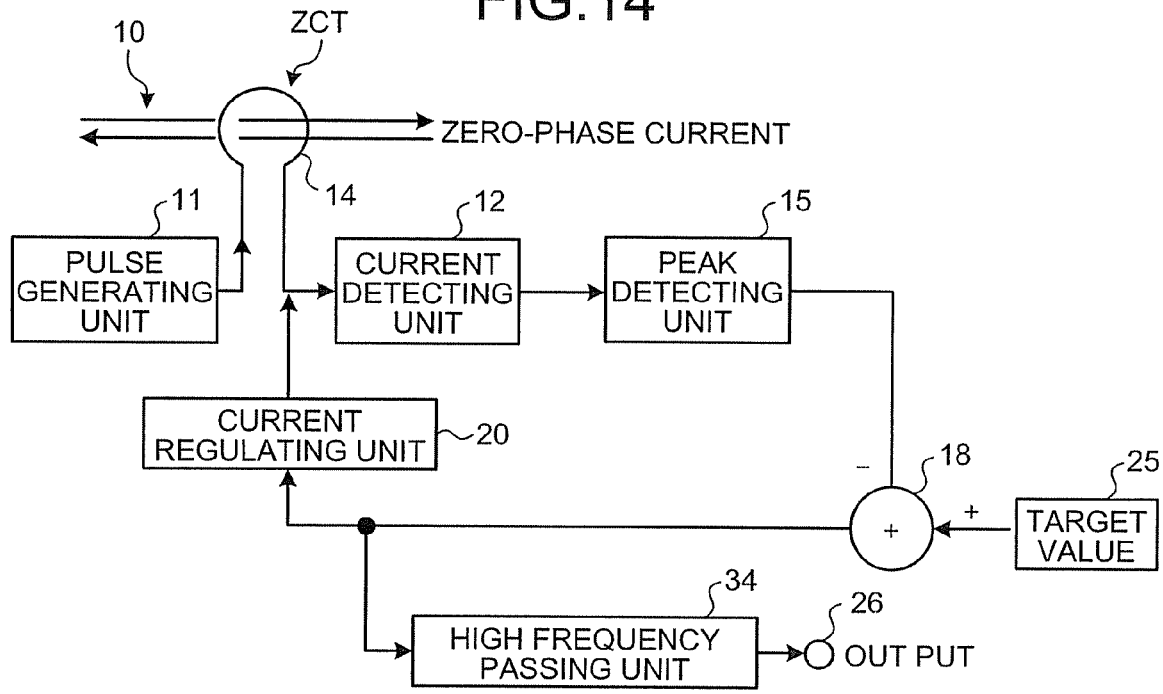
FIG. 14 is a functional block diagram of a zero-phase current detecting apparatus according to a fifth embodiment of the present invention.

FIG. 14 is a functional block diagram of a zero-phase current detecting apparatus according to a fifth embodiment of the present invention. As shown in the drawing, in the zero-phase current detecting apparatus according to the fifth embodiment, the configuration of the zero-phase current detecting apparatus shown in FIG. 1 is used as the base. In addition, the zero-phase current detecting apparatus further includes a high frequency passing unit 34 provided between the adding unit 18 and the output terminal 26. The high frequency passing unit 34 has a function to filter an output fluctuation caused by a temperature characteristic of the zero-phase-sequence current transformer ZCT. Other configurations of the zero-phase current detecting apparatus according to the fifth embodiment are the same as or similar to the configuration of the zero-phase current detecting apparatus according to the first embodiment shown in FIG. 1. The constituent elements in the same or similar configurations will be referred to by using the same reference characters, and the explanation thereof will be omitted.

Figure 15:
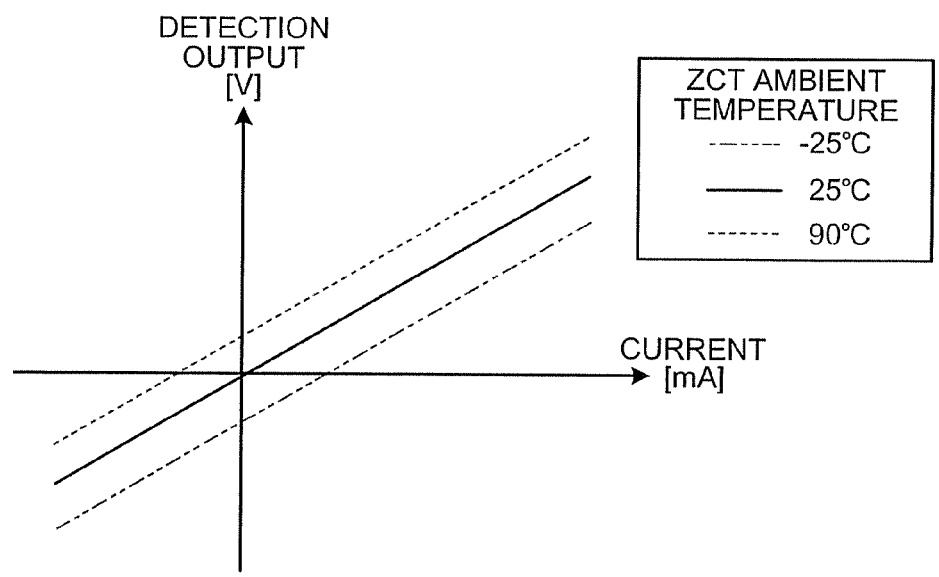
FIG. 15 is a graph of an example of a temperature characteristic of a zero-phase-sequence current transformer ZCT.

FIG. 15 is a graph of an example of the temperature characteristic of the zero-phase-sequence current transformer ZCT. The vertical axis shows the detection output of the zero-phase-sequence current transformer ZCT, while the horizontal axis shows the zero-phase current. As shown in the drawing, the output of zero-phase-sequence current transformer ZCT largely fluctuates, depending on changes in the ambient temperature thereof. Thus, the level of precision in the process to detect the zero-phase current can be lowered. To cope with this problem, according to the fifth embodiment, the high frequency passing unit 34 is provided between the adding unit 18 and the output terminal 26, as shown in FIG. 14.

On the other hand, the changes in the detection output of the zero-phase-sequence current transformer ZCT are determined by a time constant for the changes in the ambient temperature. The time constant is sufficiently larger than a time required to perform the zero-phase current detection. Thus, it is possible to perform a filtering process by using the high frequency passing unit 34. By performing the filtering process, it is possible to limit the influence from the changes in the ambient temperature and to perform the zero-phase current detection process with a high level of precision.

When the time constant of the high frequency passing unit 34 is arranged to be a short period of time, there is a higher possibility that a change in the output caused by detection of a zero-phase current and a change in the output caused by a change in the ambient temperature are erroneously detected. To cope with this problem, it is desirable to have an arrangement in which the time constant of the high frequency passing unit 34 is, for example, equal to or longer than 10 seconds. By having the arrangement in which the time constant of the high frequency passing unit 34 is equal to or longer than 10 seconds, it is possible to detect a component that has a frequency equal to or higher than 0.016 hertz (Hz), out of the detection output of the peak detecting unit. Thus, it is possible to inhibit influence from the changes in the ambient temperature and to perform the detection process with a high level of precision.

Also, depending on the degree with which the ambient temperature changes (the difference when the environment is good and when the environment is bad), another arrangement is acceptable in which the time constant of the high frequency passing unit 34 is, for example, equal to or longer than 1 minute, or equal to or longer than 20 minutes. By having the arrangement in which the value of the time constant is changed, as necessary, depending on the usage environment, it is possible to reduce the amount of undetected components related to the zero-phase current. It is also possible to lower the possibility of erroneous detection caused by the changes in the ambient temperature.

Like the magnetization forcing unit 32 according to the third embodiment, it is possible to configure the high frequency passing unit 34 by using a microcomputer. When the high frequency passing unit 34 is configured by using a microcomputer, there is no need to provide a filtering circuit. Thus, it is possible to perform the detection process with a high level of precision at a low cost.

In the description of the fifth embodiment, the example has been explained in which the configuration including the high frequency passing unit 34 provided between the adding unit 18 and the output terminal 26 is applied to the zero-phase current detecting apparatus according to the first embodiment shown in FIG. 1. However, it is also acceptable to apply the configuration including the high frequency passing unit 34 to the configuration according to the second embodiment in which the control polarity reversal preventing unit 30 is included or to the configuration according to the third embodiment in which the magnetization forcing unit 32 is included. In these situations, it is possible to achieve the advantageous effect of those embodiments, in addition to the advantageous effect of the fifth embodiment.

Sixth Embodiment

Figure 16:
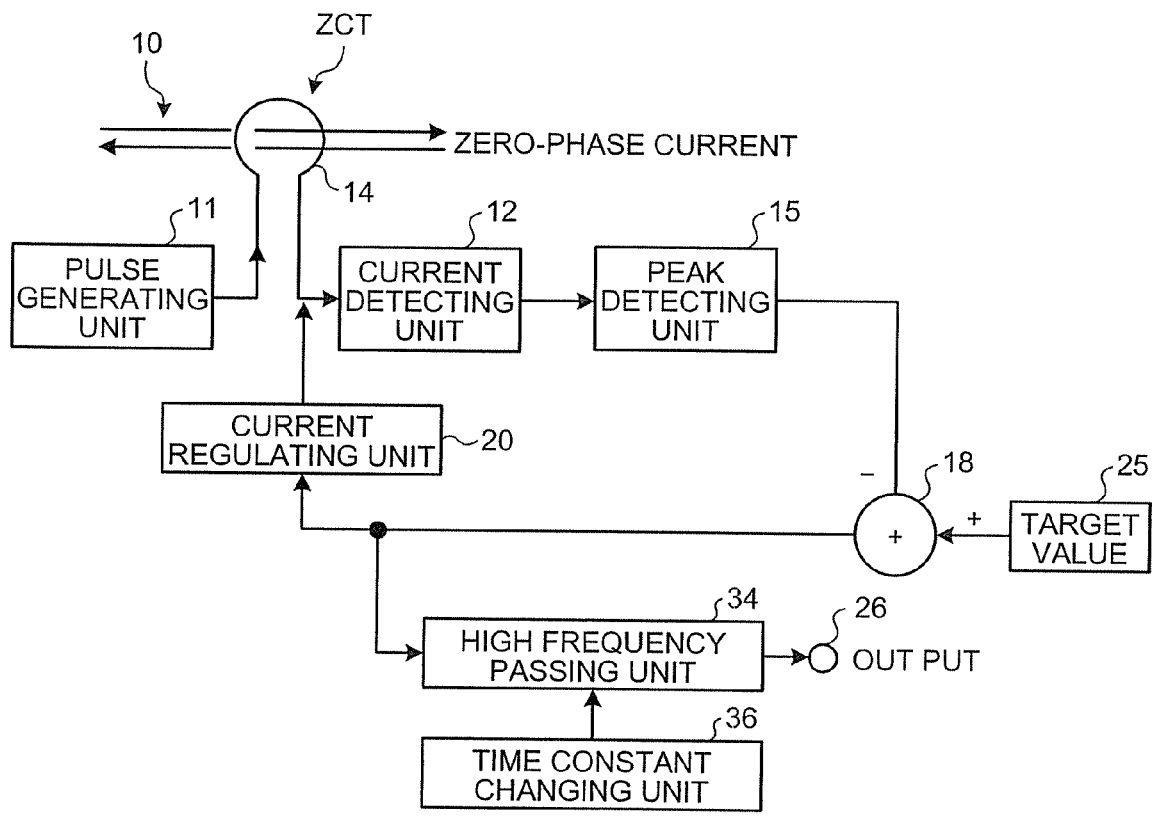
FIG. 16 is a functional block diagram of a zero-phase current detecting apparatus according to a sixth embodiment of the present invention.

FIG. 16 is a functional block diagram of a zero-phase current detecting apparatus according to a sixth embodiment of the present invention. As shown in the drawing, the zero-phase current detecting apparatus according to the sixth embodiment further includes a time constant changing unit 36 that is operable to change the time constant of the high frequency passing unit 34, in addition to the configuration of the zero-phase current detecting apparatus shown in FIG. 14. Other configurations of the zero-phase current detecting apparatus according to the sixth embodiment are the same as or similar to the configuration of the zero-phase current detecting apparatus according to the sixth embodiment shown in FIG. 14. The constituent elements in the same or similar configurations will be referred to by using the same reference characters, and the explanation thereof will be omitted.

In the description of the fifth embodiment, the example has been explained in which the time constant of the high frequency passing unit 34 is arranged to be, for example, equal to or longer than 10 seconds, so that it is possible to detect the component that has a frequency equal to or higher than 0.016 hertz, out of the detection output of the peak detecting unit.

On the other hand, to detect a zero-phase current, it is necessary to adjust a zero point (i.e., to perform an offset calibration) so that an output obtained when no zero-phase current is flowing is zero.

When the filtered output of the high frequency passing unit 34 is expressed as V(t), it is possible to express V(t) by using Equation (1):

$$V(t)=(1-e^{-(t/T)})*V_0 \quad (1)$$

where t=detection period, T=time constant, and $V_0$=regulated target voltage

As understood from Equation (1), when the time constant is large, it takes a longer period of time to adjust the zero point.

To cope with this problem, in the zero-phase current detecting apparatus according to the sixth embodiment, when the offset calibration process is performed, the time constant changing unit 36 temporarily changes the time constant of the high frequency passing unit 34 (i.e., makes it smaller). By performing the time constant changing control this way, it is possible to shorten the period of time required to adjust the zero point.

If the time constant used when the zero point adjustment is performed is changed to 1 second, and the calibration period is 4 seconds, it is possible to obtain the following Equation from Equation (1):

$$V(4)=(1-e^{-(4/1)})*V_0 \approx 0.98 V_0$$

It means that it is possible to make a fluctuation in the zero point adjustment equal to or lower than 2%, with a calibration period of 4 seconds.

In the description of the sixth embodiment, the example has been explained in which the configuration including the time constant changing unit 36 is applied to the zero-phase current detecting apparatus according to the fifth embodiment shown in FIG. 14. However, it is also acceptable to apply the configuration including the time constant changing unit 36 to the configuration according to any one of the first to the fourth embodiments including the high frequency passing unit 34. In these situations, it is possible to achieve the advantageous effect of those embodiments, in addition to the advantageous effect of the sixth embodiment.

Seventh Embodiment

Next, a zero-phase current detecting apparatus according to a seventh embodiment of the present invention will be explained. The zero-phase current detecting apparatus according to the seventh embodiment is characterized in that it provides a control method to maintain detection performances with an even higher level of precision by preventing a ripple component related to an excitation frequency of the excitation pulse from being present in a detection output. The zero-phase current detecting apparatus according to the seventh embodiment may have a configuration similar to that of the zero-phase current detecting apparatus according to any one of the first to the sixth embodiment.

Figure 17:
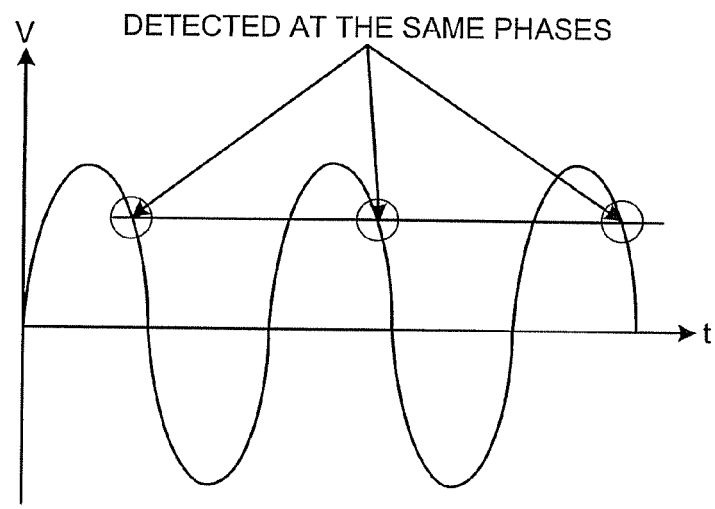
FIG. 17 is a graph of an exemplary embodiment for explaining an operation of a zero-phase current detecting apparatus according to a seventh embodiment of the present invention.

For example, in the zero-phase current detecting apparatus according to the first embodiment, an arrangement is made so that discrete values are each obtained from a predetermined phase every time (i.e., the phase is the same every time) in synchronization with the excitation cycle period of the excitation pulse, as shown in FIG. 17. By exercising control this way, it is possible to effectively suppress the ripple component contained in the detection output. Thus, it is possible to maintain a high level of precision in the detection process.

Eighth Embodiment

Next, a zero-phase current detecting apparatus according to an eighth embodiment of the present invention will be explained. The zero-phase current detecting apparatus according to the eighth embodiment is characterized in that, after a detection output is obtained as discrete values by using a sampling interval having a cycle period shorter than a half of the excitation cycle period (i.e., the frequency is two or more times higher), an excitation frequency component is eliminated by performing a digital signal processing. The zero-phase current detecting apparatus according to the eighth embodiment may have a configuration similar to that of the zero-phase current detecting apparatus according to any one of the first to the seventh embodiments.

Figure 18:
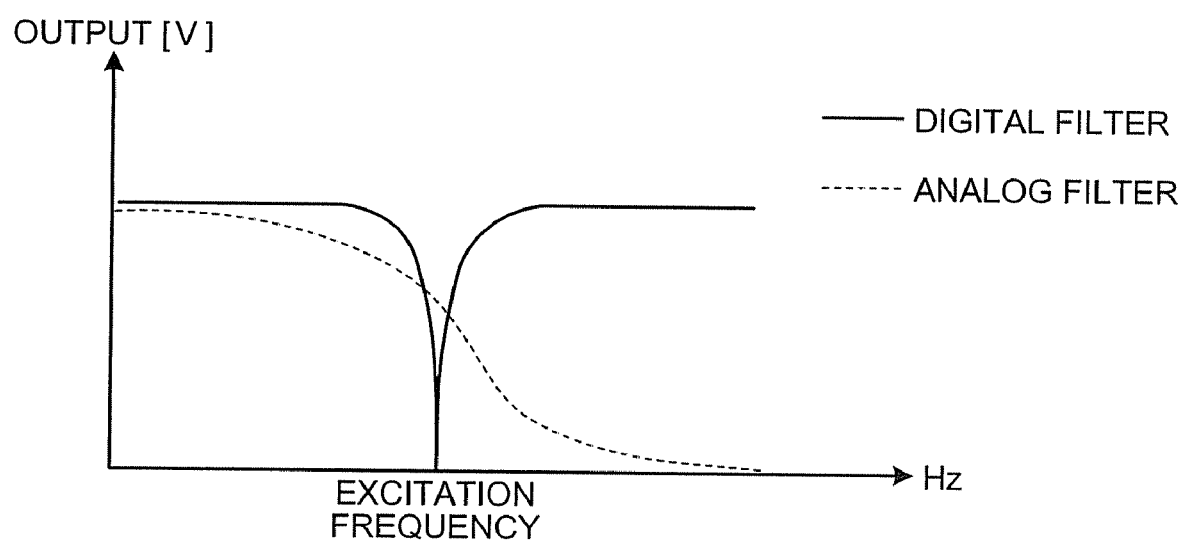
FIG. 18 is a graph for explaining a filter characteristic of a digital filter of which the eliminating frequency is set to be an excitation frequency of an excitation pulse.

FIG. 18 is a graph for explaining a filter characteristic of a digital filter of which the eliminating frequency is set to be the excitation frequency of the excitation pulse. Also, the characteristic of an analog filter equivalent to this digital filter is shown in the graph.

For example, by using the zero-phase current detecting apparatus according to the first embodiment, a sampling is performed on the detection output while the sampling frequency is set to be 4.7 kilohertz (kHz), when the excitation frequency of the excitation pulse is 2 kilohertz. After that, a filtering process is performed on a sampled output, based on the digital filter shown in FIG. 18. More specifically, according to the eighth embodiment, the sampling is performed by using a higher sampling frequency, compared to the process performed according to the seventh embodiment. As a result, after many of signal components (i.e., the target components) contained in the detection output are extracted, it is possible to eliminate the ripple component (i.e., the excitation frequency component) contained in the extracted components by using the precipitous digital filter. Accordingly, when the zero-phase current detecting apparatus according to the eighth embodiment is used, it is possible to effectively suppress the ripple component contained in the detection output. Thus, it is possible to maintain an even higher level of precision in the detection process.

As shown in FIG. 18, compared to the analog filter, the digital filter lowers the gain precipitously near the target frequency. Thus, the digital filter is able to eliminate only the target frequency components with a high level of precision. Also, digital filters have better temperature characteristic than analog filters. Thus, it is possible to perform the detection process with an even higher level of precision.

As explained above, in the zero-phase current detecting apparatus according to the first embodiment, the feedback loop is made up of the current detecting unit, the peak detecting unit, the adding unit, and the current regulating unit. The output of the peak detecting unit is regulated so as to be the target value by the control of the feedback loop. A zero-phase current flowing in the zero-phase-sequence current transformer is detected based on the output of the adding unit obtained when the output of the peak detecting unit is regulated so as to be equal to the target value. Thus, it is possible to have the detection characteristic of the peak detecting unit positioned in a linear area having linearity. Thus, it is possible to achieve a high level of precision in the detection process. In addition, there is no need to choose a special detector to maintain the level of precision in the detection process. Thus, it is possible to configure a zero-phase current detecting apparatus having a high level of precision in the detection process at a low cost.

Also, in the zero-phase current detecting apparatus according to the second embodiment, the control polarity reversal preventing unit provided between the output of the adding unit and the input of the current regulating unit operates so as to prevent the operating point of the peak detecting unit from reversing. Thus, even if a large current flows, the operating point of the peak detecting unit does not go out of the control range. Thus, it is possible to maintain a high level of precision in the detection process.

Further, in the zero-phase current detecting apparatus according to the third embodiment, the magnetization forcing unit controls the magnetized state of the detection core included in the zero-phase-sequence current transformer. Thus, the detection core included in the zero-phase-sequence current transformer maintains the predetermined magnetized state. Thus, it is possible to detect the current with a high level of precision, without receiving any influence from external magnetizing factors.

Furthermore, in the zero-phase current detecting apparatus according to the fourth embodiment, the magnetization forcing unit repeatedly and continuously performs the magnetizing operation that lasts for a shorter period of time than the excitation cycle period of the excitation pulse output by the pulse generating unit, once in every regular or non-regular cycle period of the excitation pulse. Thus, it is possible to maintain a stable magnetized state. Accordingly, it is possible to perform the detection process with a high level of precision.

Also, in the zero-phase current detecting apparatus according to the fifth embodiment, the time constant of the high frequency passing unit that passes the high frequency component in the output of the adding unit is arranged to be equal to or longer than one second. Thus, it is possible to detect a component that has a frequency equal to or higher than 0.016 hertz, out of the detection output of the peak detecting unit. Consequently, it is possible to inhibit the influence from the changes in the ambient temperature and to perform the detection process with a high level of precision.

Further, in the zero-phase current detecting apparatus according to the sixth embodiment, when a zero point adjustment is performed upon an activation of the zero-phase current detecting apparatus, the time constant changing unit that is operable to change the time constant of the high frequency passing unit temporarily makes the time constant smaller than the arranged value used during the operation. Thus, it is possible to shorten the period of time required to perform the zero adjustment.

Furthermore, in the zero-phase current detecting apparatus according to the seventh embodiment, the digital processor that has the function of the high frequency passing unit outputs, as discrete values, sampled values out of the output of the adding unit that are obtained in synchronization with the excitation cycle period of the excitation pulse. Thus, it is possible to effectively suppress the ripple component contained in the detection output. Consequently, it is possible to maintain a high level of precision in the detection process.

Also, in the zero-phase current detecting apparatus according to the eighth embodiment, when outputting the sampled values out of the output of the adding unit as the discrete values, the digital processor that has the function of the high frequency passing unit obtains the sampled values by using a cycle period shorter than a half of the excitation cycle period of the excitation pulse and also eliminates the excitation frequency component of the excitation pulse contained in the discrete values by performing a digital signal processing. Thus, it is possible to effectively suppress the ripple component contained in the detection output. Consequently, it is possible to maintain an even higher level of precision in the detection process.

It is possible to use the zero-phase current detecting apparatus according to any one of the first to the eighth embodiments as, for example, a ground-fault detecting circuit for a grid-connected inverter apparatus. In particular, the grid-connected inverter apparatus may be an inverter apparatus for a photovoltaic power generation system. It is more useful to apply the zero-phase current detecting apparatus according to the present invention to such a photovoltaic power generation system that has gotten a lot of attention as a clean energy source against the backdrop of recent increases in environmental problems on a world-wide scale.

INDUSTRIAL APPLICABILITY

As explained above, the zero-phase current detecting apparatus according to the present invention is useful for application to, for example, a ground-fault detecting circuit for a grid-connected inverter apparatus.

The invention claimed is:

1. A zero-phase current detecting apparatus comprising:
a zero-phase-sequence current transformer that includes a magnetic core and a detection coil wound around the core, and that detects a zero-phase current flowing in an electric power line; and
a feedback loop is made up of
a pulse generating unit that applies an excitation pulse signal to one end of the detection coil;
a current detecting unit that converts a current flowing through the detection coil into a voltage and outputs the voltage;
a peak detecting unit that detects a peak value of the voltage output from the current detecting unit;
an adding unit that outputs a difference between a target value and the peak value detected by the peak detecting unit; and
a current regulating unit that regulates the current flowing in the detection coil based on the difference output from the adding unit, wherein
the zero-phase current is detected based on the difference output from the adding unit as a result of regulation of the peak value so as to be the target value in the adding unit.

2. The zero-phase current detecting apparatus according to claim 1, further comprising a target-value setting circuit that changes the target value so that an operating point of the peak detecting unit is positioned in a linear area within an output characteristic of the peak detecting unit.

3. The zero-phase current detecting apparatus according to claim 2, further comprising an operation-range limiting unit that prevents the operating point of the peak detecting unit from going out of a control range.

4. The zero-phase current detecting apparatus according to claim 1, further comprising a magnetization forcing unit that controls magnetization of the detection core.

5. The zero-phase current detecting apparatus according to claim 4, wherein
the zero-phase-sequence current transformer includes a secondary coil, and
the magnetization forcing unit controls the magnetization of the detection core by causing a current to flow through the secondary coil.

6. The zero-phase current detecting apparatus according to claim 5, wherein the secondary coil is the detection coil.

7. The zero-phase current detecting apparatus according to claim 5, wherein the secondary coil is different from the detection coil and is wound around the detection core.

8. The zero-phase current detecting apparatus according to claim 4, wherein the magnetization forcing unit controls the magnetization of the detection core by causing a current to flow through a primary side of the zero-phase-sequence current transformer.

9. The zero-phase current detecting apparatus according to claim 4, wherein the magnetization forcing unit repeatedly and continuously performs a magnetizing operation that lasts for a shorter period of time than an excitation cycle of the excitation pulse output by the pulse generating unit, once in every regular or non-regular cycle period of the excitation pulse.

10. The zero-phase current detecting apparatus according to claim 4, wherein when exercising a magnetization control, the magnetization forcing unit suppresses a magnetizing current that is caused to flow so that the flowing of the magnetizing current is equal to or shorter than 20% of an excitation cycle of the excitation pulse.

11. The zero-phase current detecting apparatus according to claim 4, wherein the magnetization forcing unit performs a magnetizing operation one or more times in every excitation cycle period.

12. The zero-phase current detecting apparatus according to claim 4, wherein the magnetization forcing unit is configured with a digital processor.

13. The zero-phase current detecting apparatus according to claim 1, further comprising a high-frequency passing unit that passes a high frequency component in the difference output from the adding unit, wherein
a time constant of the high-frequency passing unit is arranged to be equal to or longer than one second.

14. The zero-phase current detecting apparatus according to claim 13, further comprising a time-constant changing unit that is operable to change the time constant of the high-frequency passing unit, wherein
when a zero point adjustment is performed upon an activation of the zero-phase current detecting apparatus, the time-constant changing unit temporarily makes the time constant smaller than the arranged value.

15. The zero-phase current detecting apparatus according to claim 14, wherein the high-frequency passing unit and the time-constant changing unit are configured with a digital processor.

16. The zero-phase current detecting apparatus according to claim 15, wherein the digital processor outputs, as discrete values, sampled values out of the difference output from the adding unit that are obtained in synchronization with an excitation cycle period of the excitation pulse.

17. The zero-phase current detecting apparatus according to claim 16, wherein the digital processor obtains the discrete values from a predetermined phase position within the excitation cycle period.

18. The zero-phase current detecting apparatus according to claim 16, wherein the digital processor obtains the discrete values by using a cycle period shorter than a half of the excitation cycle period and eliminates an excitation frequency component of the excitation pulse contained in the discrete values by performing a digital signal processing.

19. The zero-phase current detecting apparatus according to claim 1, wherein the zero-phase current detecting apparatus is used as a ground-fault detecting circuit for a grid-connected inverter apparatus.

20. The zero-phase current detecting apparatus according to claim 19, wherein the grid-connected inverter apparatus is an inverter apparatus for a photovoltaic power generation system.

* * * * *